United States Patent
Liu (10) Patent No.: US 10,941,037 B2
(45) Date of Patent: Mar. 9, 2021

(54) STRUCTURE AND METHODOLOGY FOR DETECTING DEFECTS DURING MEMS DEVICE PRODUCTION

(71) Applicant: NXP USA, Inc., Austin, TX (US)

(72) Inventor: Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 105 days.

(21) Appl. No.: 16/237,801

(22) Filed: Jan. 2, 2019

(65) Prior Publication Data

US 2020/0207618 A1 Jul. 2, 2020

(51) Int. Cl.
*B81C 99/00* (2010.01)
*G01R 27/26* (2006.01)
*G01R 31/26* (2020.01)
*G01R 31/28* (2006.01)

(52) U.S. Cl.
CPC ........ *B81C 99/004* (2013.01); *G01R 27/2605* (2013.01); *G01R 31/2637* (2013.01); *G01R 31/2831* (2013.01)

(58) Field of Classification Search
None
See application file for complete search history.

(56) References Cited

U.S. PATENT DOCUMENTS

| | | | |
|---|---|---|---|
| 8,440,523 B1 | 5/2013 | Guillorn et al. | |
| 8,883,535 B2 | 11/2014 | Liu | |
| 9,793,186 B1 * | 10/2017 | Seddon | H01L 22/12 |
| 2007/0069759 A1 * | 3/2007 | Rzepiela | G01R 31/2831 324/762.05 |
| 2008/0206908 A1 * | 8/2008 | Walter | H01L 22/34 438/18 |
| 2014/0264767 A1 | 9/2014 | Gratz et al. | |
| 2015/0225229 A1 | 8/2015 | Liu | |

OTHER PUBLICATIONS

Kuo, Chinte et al., "Subtle gate oxide defect elimination to improve the reliability of a 32M-bit SRAM product", Materials Science in Semiconductor Processing, Jan. 1, 2016, pp. 485-490, vol. 41, Elsevier, Amsterdam, Netherlands.

* cited by examiner

*Primary Examiner* — Steven M Christopher
(74) *Attorney, Agent, or Firm* — Charlene R. Jacobsen

(57) ABSTRACT

A wafer includes a process control monitor (PCM) structure formed on a substrate. The PCM structure includes detection and reference structures. The detection structure includes a first electrically conductive line arrangement formed in a first structural layer on the substrate and a first protection layer surrounding the first electrically conductive line arrangement. The reference structure includes a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material. The insulator material does not overlie the detection structure. Methodology entails measuring a capacitance between the detection structure and the substrate, measuring another capacitance between the reference structure and substrate, and comparing the two capacitances to determine whether defects exist.

12 Claims, 6 Drawing Sheets

FIG. 1

PRIOR ART

STRUCTURE AND METHODOLOGY FOR DETECTING DEFECTS DURING MEMS DEVICE PRODUCTION

TECHNICAL FIELD OF THE INVENTION

The present invention relates generally to microelectromechanical systems (MEMS) devices. More specifically, the present invention relates to process control monitoring for detecting defects during MEMS device production.

BACKGROUND OF THE INVENTION

Microelectromechanical systems (MEMS) sensors are widely used in applications such as automotive, inertial guidance systems, household appliances, game devices, protection systems for a variety of devices, and many other industrial, scientific, and engineering systems. MEMS technology provides a way to make very small mechanical structures and integrate these structures with electrical devices on a single substrate using conventional batch semiconductor device processing techniques. These semiconductor device processing techniques typically include photolithographic patterning, sputtering, evaporation, and wet and dry etching.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a process control monitor (PCM) structure and methodology for detecting defects that may occur during microelectromechanical systems (MEMS) device production. The defects, which may result from MEMS device fabrication process steps, can lead to reliability concerns for MEMS device applications. The PCM monitor structure and methodology can be implemented to electrically detect defects to screen defective wafers and/or dies during MEMS device production, in lieu of or in addition to inline optical inspection.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
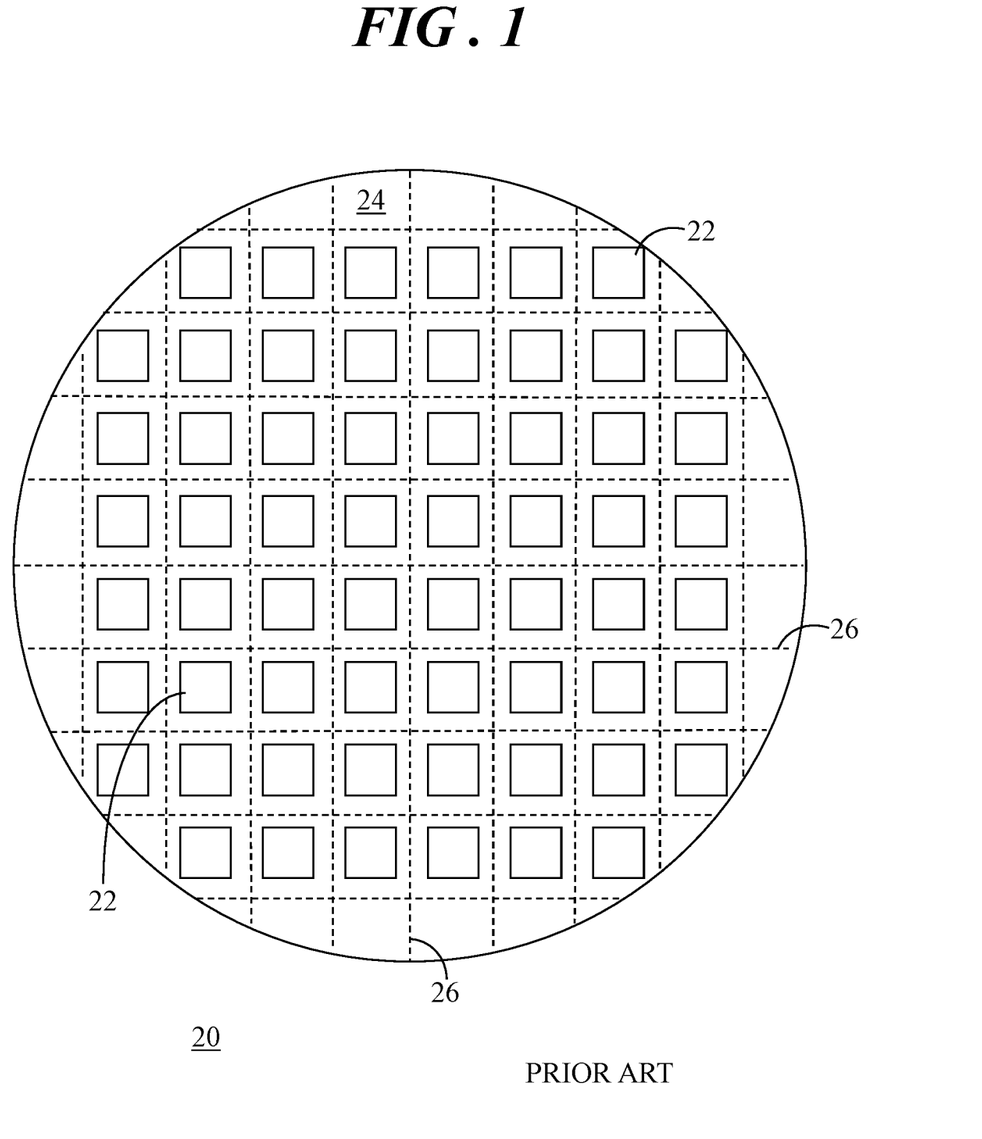
FIG. 1 depicts, in a simplified and representative form, a top view of a production wafer having a plurality of microelectromechanical systems (MEMS) devices formed thereon.
Figure 2:
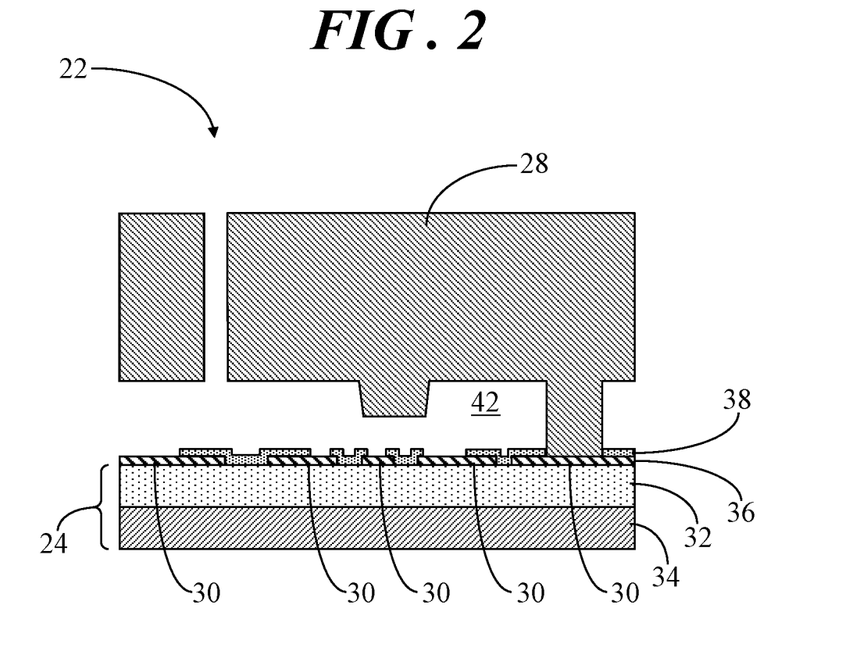
FIG. 2 shows a partial side sectional view of a MEMS device of the production wafer of FIG. 1.

Referring to FIGS. 1 and 2, FIG. 1 depicts, in a simplified and representative form, a top view of a production wafer, referred to herein as a MEMS device wafer 20, having a plurality of MEMS 22 devices formed thereon, and FIG. 2 shows a partial side sectional view of one of MEMS devices 22 of the MEMS device wafer 20. MEMS devices 22 (represented by solid line squares in FIG. 1) may be formed in or on a MEMS substrate 24 by, for example, bulk or surface micromachining in accordance with known methodologies.

Boundaries of each of MEMS devices 22 are delineated in FIG. 1 by scribe lines, also known as die streets 26. Per convention, following fabrication of MEMS devices 22, MEMS device wafer 20 is sawn, diced, or otherwise separated into individual dies, each of which contains one of MEMS devices 22. The individual MEMS devices 22 can be packaged with other MEMS devices, application specific integrated circuits, and so forth in accordance with a particular package design. MEMS device wafer 20 includes only a few MEMS devices 22 for simplicity of illustration. Those skilled in the art will readily recognize that MEMS device wafer 20 can include any quantity of MEMS devices 22 in accordance with the diameter of MEMS substrate 24, the capability of a particular fabrication plant, and/or the size of MEMS devices 22.

In an embodiment, MEMS devices 22 may be capacitive-sensing motion sensors (e.g., accelerometers, angular rate sensors, and the like) each having, for example, an active region 28 suspended above MEMS substrate 24. Active region 28 may be a movable element, sometimes referred to as a proof mass, or any other feature used to sense an external stimulus, and electrically conductive microstructures 30 may be formed on MEMS substrate 24 underlying active region 28.

MEMS substrate 24 may have undergone various surface preparation processes. By way of example, surface preparation of MEMS substrate 24 may entail backside mark formation, surface cleaning, thermal oxidation to form a substrate oxide layer 32 (e.g., a dielectric layer) overlying a silicon layer 34, and so forth as known to those skilled in the art. When layer 34 is composed of silicon, substrate oxide layer 32 may grow as silicon oxide over the exposed surfaces of silicon layer 34 of MEMS substrate 24. Alternatively, substrate oxide layer 32 may be deposited utilizing, for example, a chemical vapor deposition (CVD) process.

A first electrically conductive structural layer 36 may be formed on substrate oxide layer 32. First electrically conductive structural layer 36 may be a polysilicon or metal layer that is deposited on substrate oxide layer 32 and is thereafter suitably patterned and etched to form microstructures 30. A protective material layer 38 may be formed over first structural layer 36 and over exposed regions of field oxide layer 32. For example, a nitride, e.g., silicon nitride) may be deposited on first structural layer 36 by low-pressure chemical vapor deposition (LPCVD) to form a thin nitride layer. The nitride layer can then be patterned using, for example, a photolithographic process. Thereafter, the nitride layer can be etched to produce a patterned nitride layer, e.g., protective material layer 38, that covers and protects first structural layer 36 at certain regions and exposes first structural layer 36 at other predetermined locations in accordance with a particular design specification for MEMS devices 22. Thus, microstructures 30 can serve as sense electrodes and/or electrically conductive interconnect lines underlying active region 28.

Although not shown in FIG. 2, an insulator material, referred to herein as a sacrificial dielectric material, is next deposited over first structural layer 36 and protective material layer 38 in accordance with known methodologies. The sacrificial dielectric material may be formed from a deposited oxide. For example, the sacrificial dielectric material may be a silicon oxide deposited utilizing a low temperature Plasma-Enhanced CVD or Low Pressure CVD process with a silane ($SiH_4$) or tetraethylorthosilicate ($Si(OC_2H_5)_4$ or "TEOS") chemistry.

Next, a second electrically conductive structural layer, referred to herein as a transducer layer 40 may be formed over the sacrificial dielectric material. Transducer layer 40 may be a polysilicon layer that is deposited on the sacrificial dielectric material (not shown) and is suitably patterned and etched to form transducer structures, including anchor regions, of active region 28 of MEMS devices 22. In an example, transducer layer 28 may be fabricated utilizing a so-called "high-rate deposition (HD) polycrystalline silicon" or, more simply, an "HD poly" fabrication process in which a relatively thick layer of polycrystalline silicon is deposited over MEMS substrate 24 and then lithographically patterned to produce active region 28 in transducer layer 40. In another example, the transducer structures may initially be produced from a separate discrete wafer or transducer workpiece. In this example, the transducer workpiece or wafer may be bonded to the workpiece in which MEMS substrate 24 and the layers formed thereover are included.

Initially, movement of the movable elements, e.g., proof mass and spring structures, in active region 28 of MEMS devices 22 are prevented or impeded from movement by the underlying sacrificial dielectric material (not shown). Thus, the sacrificial dielectric material is now removed, in whole or in part, to mechanically release the movable elements of the MEMS devices. For example, the sacrificial dielectric material may be removed through transducer layer openings utilizing an etchant having a chemistry that is selective to the parent material of the sacrificial dielectric layer. For example, in processes in which the sacrificial dielectric layer is composed of a silicon oxide, a wet etch or vapor phase etch (VPE) utilizing a fluoride-based etch chemistry (e.g., hydrogen fluoride, also known as hydrofluoric acid) may be employed. The resulting structure, as shown in FIG. 2, includes a void area 42 that has been produced via the removal of the sacrificial dielectric material, thereby mechanically releasing the spring members and proof mass structures at active region 28. Although not shown, a cap wafer may then be bonded over the partially-fabricated MEMS devices 22, and wafer 20 can be singulated along die streets 26 to complete production of the MEMS devices 22.

Figure 3:
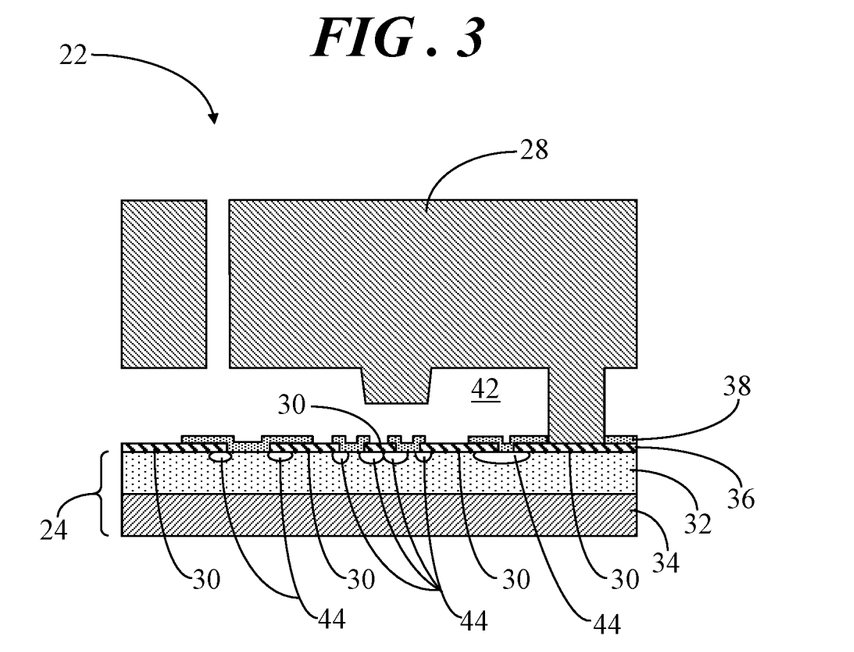
FIG. 3 shows a partial side sectional view of a MEMS device of the production wafer in which defects are present.

Referring now to FIG. 3, FIG. 3 shows a partial side sectional view of one of MEMS devices 22 of the MEMS device wafer 20 in which defects 44 are present. It has been observed that defects 44 can occur during wafer production. In particular, substrate oxide layer 32 below either of first structural layer 36 and protective material layer 38 may get attacked/etched during VPE release of the movable elements of the MEMS devices 22. This etching into substrate oxide layer 32 may occur, for example, due to the hydrogen fluoride penetrating either first structural layer 36 (polysilicon) and/or the interface between first structural layer 36 and protective material layer 38 (e.g., nitride) to reach and subsequently etch away substrate oxide layer 32.

In certain situations, these undercut defects 44 can result in floating bridges of microstructures 30 in first structural layer 36 or weak microstructures 30 depending upon the size and extent of defects 44. Defects 44, therefore, increase the risk of broken structures during backend processes or during in-use shock events leading to reliability concerns. Inline optical inspection of MEMS device wafer 20 (FIG. 1) can "see" only those defects 44 that are not overlapped by the suspended MEMS structures. Embodiments discussed below implement process control monitor (PCM) structures and methodology for electrically detecting manufacturing defects 44. The PCM structures and associated methodology may be implemented to detect defects 44 even at locations that are overlapped by suspended MEMS structures.

Figure 4:
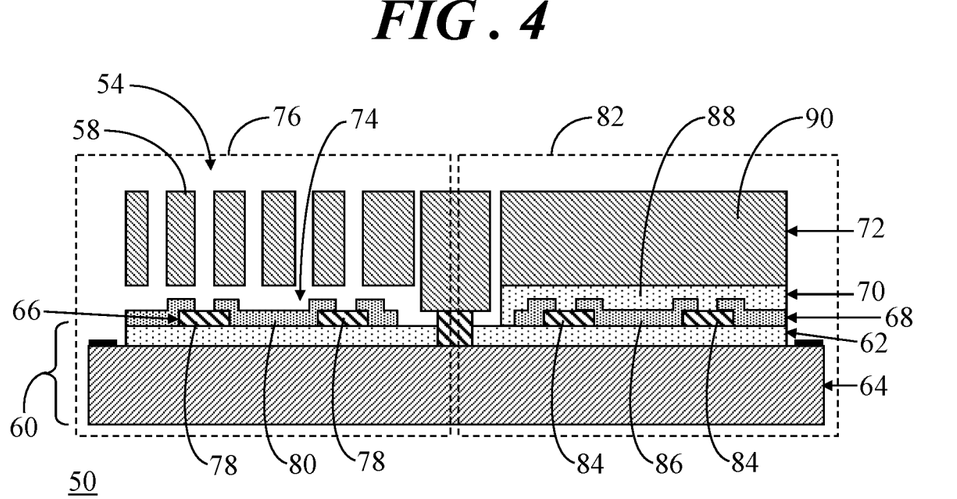
FIG. 4 shows a side sectional view of a process control monitor (PCM) structure in accordance with an embodiment.
Figure 5:
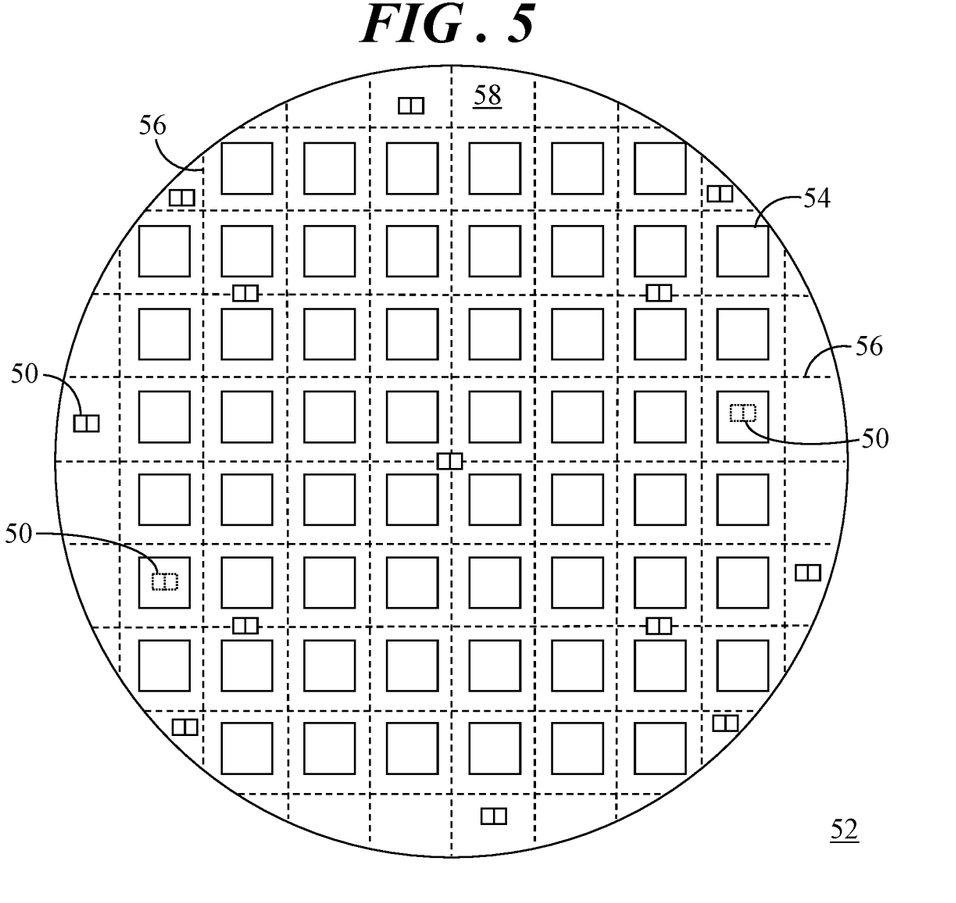
FIG. 5 shows a top view of a production wafer having a plurality of microelectromechanical systems (MEMS) devices and PCM structures formed thereon.

Referring to FIGS. 4 and 5, FIG. 4 shows a side sectional view of a process control monitor (PCM) structure 50 in accordance with an embodiment and FIG. 5 shows a top view of a production wafer, referred to as a MEMS device wafer 52, having a plurality of MEMS devices 54 and PCM structures 50 formed thereon. Like MEMS device wafer 20 (FIG. 1) discussed above, MEMS device wafer 52 can include a multiplicity of MEMS devices 54, the boundaries of which are delineated by scribe lines, also known as die streets 56. MEMS devices 54 may be capacitive-sensing motion sensors (e.g., accelerometers, angular rate sensors, and the like) each having, for example, an active region 58 suspended above a MEMS substrate 60. Like MEMS devices 22 (FIG. 2), active region 58 may include a movable element, sometimes referred to as a proof mass, or any other structures used for sensing an external stimulus.

One or more PCM structures 50 are formed on MEMS substrate 60. PCM structures 50 may be distributed across MEMS device wafer 52 at various distinct regions of MEMS device wafer 52 at which defects 44 (FIG. 3) are more likely to be present. These regions could include at the edges of MEMS device wafer 52 and/or in certain quadrants of MEMS device wafer 52. Additionally, PCM structures 50 (represented in solid line form) may be laterally spaced apart from MEMS devices 54. Additionally, or alternatively, PCM structures 50 may be located below one or more MEMS devices 54 such that active region 58 of one or more MEMS devices 54 overlies one or more PCM structures 50. This configuration is denoted in FIG. 5 by PCM structures 50 being represented in dotted line form encompassed by blocks that represent MEMS devices 54.

MEMS device wafer 52 may be manufactured in the same manner as MEMS device wafer 20 to include the same or similar material layers. Therefore, in general, MEMS substrate 60 includes a substrate oxide layer 62 overlying a silicon layer 64. A first electrically conductive structural layer 66 (e.g., polysilicon, metal, and the like) may be formed on substrate oxide layer 62. A protective material layer 68 (e.g., silicon nitride) may be formed that covers and protects first structural layer 66 at certain regions and exposes first structural layer 66 at other predetermined locations in accordance with a particular design specification for MEMS devices 54.

A sacrificial insulator material 70 (e.g., a sacrificial dielectric material such as an oxide material) is next deposited over first structural layer 66 and protective material layer 68 in accordance with known methodologies, and a second electrically conductive structural layer 72 may be formed over sacrificial insulator material 70. Second electrically conductive structural layer 72 may be a polysilicon layer that is deposited on sacrificial dielectric material 70 and is suitably patterned and etched to form transducer structures of active region 58 of MEMS devices 54. In an example, active region 58 may be fabricated utilizing an HD poly fabrication process in which a relatively thick layer of polycrystalline silicon is deposited over MEMS substrate 60 and then lithographically patterned to produce active region 58. Thereafter, sacrificial insulator material 70 is removed via, for example, VPE utilizing a fluoride-based etch chemistry (e.g., hydrogen fluoride, also known as hydrofluoric acid). The resulting structure, as shown in FIG. 4, includes a void area 74 that has been produced via the removal of the sacrificial dielectric layer, thereby mechanically releasing the spring members and proof mass structures at active region 58.

PCM structures 50 may be fabricated concurrent with the fabrication processes of MEMS devices 54. Further, as mentioned above PCM structures 50 may be laterally displaced away from MEMS devices 54 and/or PCM structures 50 may be positioned under MEMS devices 54. For simplicity, a single PCM structure 50 will now be described below. In this example, at least a portion of PCM structure 50 is located below active region 58 of MEMS device 54. It should be understood, however, that the following description applies equivalently to each of PCM structures 50 of MEMS device wafer 52.

PCM structure 50 includes a detection structure 76 (delineated by a dashed line box) having a first electrically conductive line arrangement 78 formed in first structural layer 66 on substrate 60 and a first protection layer 80 surrounding first electrically conductive line arrangement 78. PCM structure 50 further includes a reference structure 82 (delineated by another dashed line box) having a second electrically conductive line arrangement 84 formed in first structural layer 66 on substrate 60 and a second protection layer 86 surrounding second electrically conductive line arrangement 84. It should be noted that first and second protection layers 80, 86 are both formed from protective material layer 68, which may be silicon nitride. Reference structure 82 further includes a portion 88 of sacrificial insulator material 70 overlying second electrically conductive line arrangement 84 and second protection layer 86 and a portion 90 of second structural layer 72 overlying sacrificial insulator material 70.

In this example, active region 58 of MEMS device 54 overlies detection structure 76. Hence, sacrificial insulator material 70 does not overlie detection structure 76 so that the spring members and proof mass structures are mechanically released at active region 58. In another example, when MEMS device 54 does not overlie detection structure 76, sacrificial insulator material 70 is also absent from detection structure 76 so that sacrificial insulator material 70 does not overlie detection structure 76.

Sacrificial insulator material 70 is removed from detection structure 76 during the wet etch or vapor phase etch (VPE) process. Accordingly, removal of sacrificial insulator material 70 enhances the probability of the formation of defects 44 (FIG. 3) at detection structure 76. Conversely, the presence of sacrificial insulator material 70 (e.g., the non-removal of sacrificial insulator material 70 at reference structure 82) and second structural layer 72 overlying reference structure 82 decreases the probability of the formation of defects 44 at reference structure 82. This key difference between detection structure 76 and reference structure 82 can be exploited by taking electrical measurements (discussed below) in order to detect the presence of defects 44 at detection structure 76 and thereby provide a monitoring mechanism for detecting defects 44 in MEMS device wafer lots and/or at particular regions of MEMS device wafers.

Figure 6:
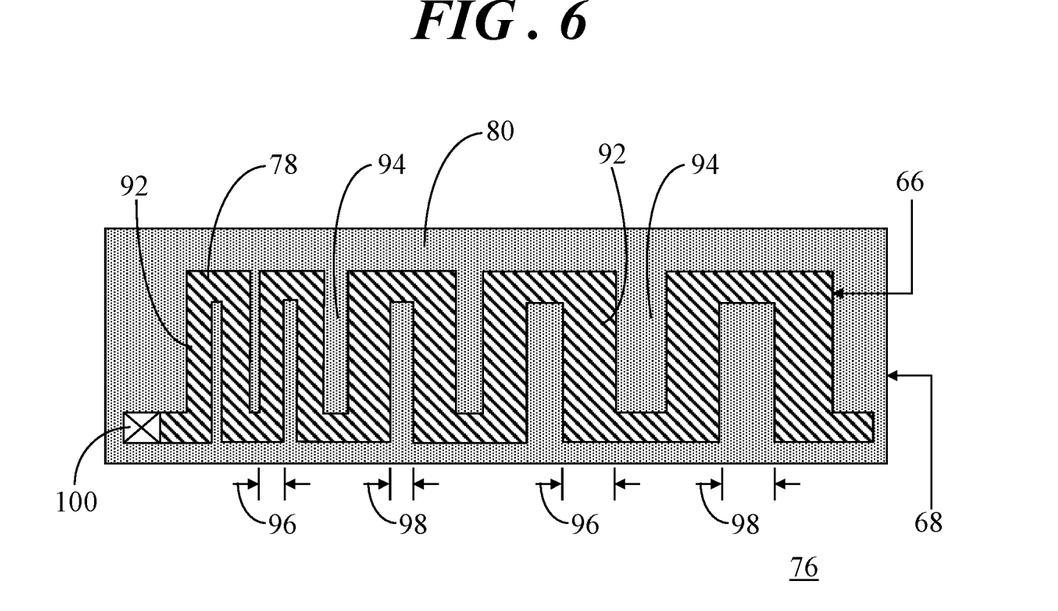
FIG. 6 shows a top view of a detection structure of the PCM structure of FIG. 4.
Figure 7:
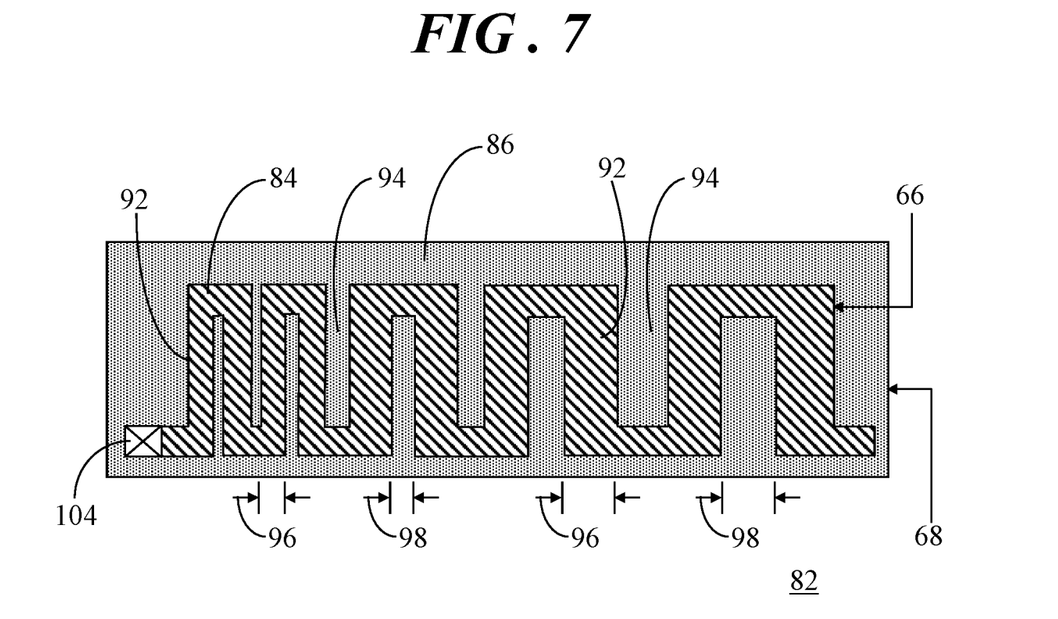
FIG. 7 shows a top view of a reference structure of the PCM structure of FIG. 4.

Referring now to FIGS. 6 and 7 in connection with FIG. 4, FIG. 6 shows a top view of detection structure 76 of PCM structure 50 and FIG. 7 shows a top view of reference structure 82 of the PCM structure 50. More specifically, FIG. 6 shows first electrically conductive line arrangement 78 in first structural layer 66 (e.g., polysilicon) and first protection layer 80 in protective material layer 68 (e.g., nitride). Similarly, FIG. 7 shows second electrically conductive line arrangement 84 in first structural layer 66 and second protection layer 86 in protective material layer 68. In FIG. 7, portion 88 of sacrificial insulator material 70 and second structural layer 72 are not shown in order to observe the underlying second electrically conductive line arrangement 84. Although the overlap of protective material layer 68 over first structural layer 66 is shown in FIG. 4, this overlap is not visible in FIGS. 6 and 7.

In some embodiments, first and second electrically conductive line arrangements 78, 84 are duplicates of one another. First and second electrically conductive line arrangements 78, 84 are duplicates of one another so that when detection structure 76 does not have defects 44 (FIG. 3), the electrical measurement values (e.g., capacitance values, discussed below) will be the same within some predetermined tolerance.

In the illustrated configuration, each of first and second electrically conductive line arrangements 78, 84 is a serpentine structure having multiple serially connected line segments 92. Line segments 92 are generally arranged parallel to one another and are spaced apart from one another by gaps 94. In some embodiments, line segments 92 have different segment widths 96. In other embodiments, gaps 94 have different gap widths 98. In still other embodiments, first and second electrically conductive line arrangements 78, 84 have a combination of different segment widths 96 and different gap widths 98. First and second electrically conductive line arrangements 78, 84 have different segment widths 96 and/or different gap widths 98 to correspond with the variable sizes of the microstructures (e.g., microstructures 30 of FIG. 2) formed in order to model the particular design configuration of MEMS devices 54 and determine the significance of defects 44 (FIG. 3) relative to the size of the microstructures.

With continued reference to FIGS. 4, 6, and 7, PCM structure 50 is suitably configured such that electrical measurements may be taken in order to detect the presence of defects 44 (FIG. 3), as mentioned previously. Accordingly, a first probe pad 100 (represented in FIG. 6 by an "X" surrounded by a box) is electrically coupled with first electrically conductive line arrangement 78. Additionally, a second probe pad 102 (visible in FIG. 4) may be formed on a shelf region MEMS substrate 60. First and second probe pads 100, 102 are configured for measurement of a first capacitance value, C1, between first electrically conductive line arrangement 78 and silicon layer 64 of MEMS substrate 60. Similarly, a third probe pad 104 (represented in FIG. 7 by an "X" surrounded by a box) is electrically coupled with second electrically conductive line arrangement 84. Additionally, a fourth probe pad 106 (visible in FIG. 4) may be formed on a shelf region of MEMS substrate 60. Third and fourth probe pads 104, 106 are configured for measurement of a second capacitance value, C2, between second electrically conductive line arrangement 84 and silicon layer 64 of MEMS substrate 60.

Figure 8:
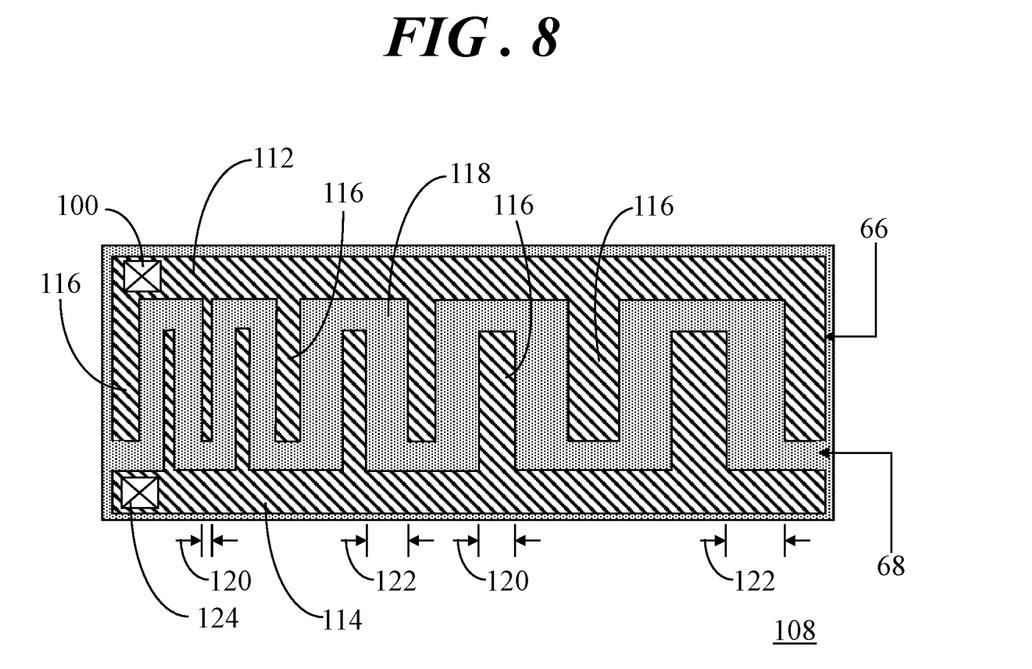
FIG. 8 shows a top view of a detection structure that may be implemented the PCM structure of FIG. 4 in accordance with an alternative embodiment.
Figure 9:
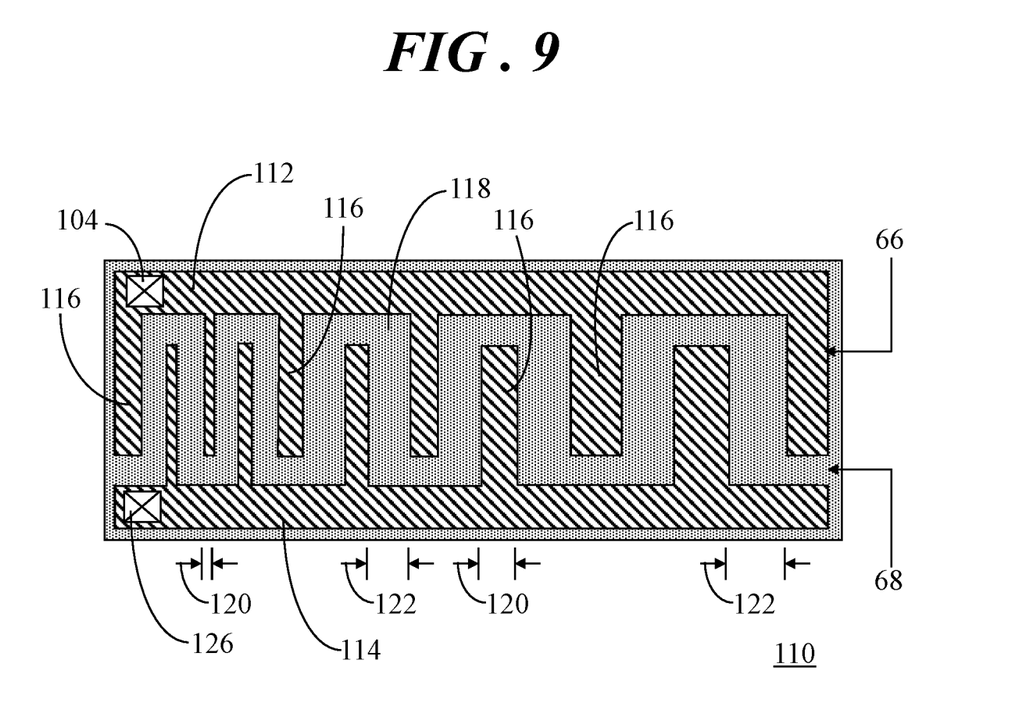
FIG. 9 shows a top view of a reference structure that may be implemented the PCM structure of FIG. 4 in accordance with an alternative embodiment.

Referring now to FIGS. 8 and 9, FIG. 8 shows a top view of a detection structure 108 that may be implemented in PCM structure 50 (FIG. 4) and FIG. 9 shows a top view of a reference structure 110 that may be implemented in PCM structure 50 (FIG. 4) in accordance with another embodiment. Again, detection and reference structures 108, 110 are duplicates of one another. Further, the overlap of protective material layer 68 over first structural layer 66 shown in FIG. 4, is not visible in FIGS. 8 and 9.

In this illustrated configuration each of detection and reference structures 108, 110 includes a pair of comb structures 112, 114 each having line segments 116 in the form of interdigitated fingers. Line segments 116 are generally arranged parallel to one another and are spaced apart from one another by gaps 118. Again, line segments 116 may have different segment widths 120 and/or different gap widths 122, as discussed above. In this illustration, detection structure 108 includes first probe pad 100 electrically coupled with comb structure 112 and another probe pad 124 electrically coupled with comb structure 112. Similarly, reference structure 110 includes third probe pad 104 and another probe pad 126 electrically coupled with 114.

In the configuration of FIGS. 6 and 7, capacitance values are measured between silicon layer 64 of MEMS substrate 60 and the respective first and second line arrangements 78, 84, respectively. The measured capacitance values may be effectively utilized to detect defects that occur at the regions at which the nitride protective material layer 68 overlaps first and second line arrangements 78, 84. In the configuration of FIGS. 8 and 9, capacitance values can also be measured between silicon layer 64 of MEMS substrate 60 and the respective comb structures 112, 114 to detect defects that occur at the regions at which the nitride protective material layer 68 overlaps first and second line arrangements 78, 84. Additionally, in the configuration of FIGS. 8 and 9, capacitance values can be measured between probe pads 100, 124 to determine a comb-to-comb capacitance between comb structures 112, 114 of detection structure 108 and between probe pads 104, 126 to determine a comb-to-comb capacitance between comb structures 112, 114 of reference structure 110. The comb-to-comb capacitance values may be utilized to detect defects between the interdigitated line segments 116.

Even though the serpentine and comb structure configurations are described separately, it should be understood that both of the serpentine and comb structure configurations may be included on a single MEMS device wafer structure. Further, it should be understood that the line arrangements of the detection and reference structures may be any of a variety of sizes and shapes to generally mimic the design configuration of the microstructures located in first electrically conductive structural layer 66.

Figure 10:
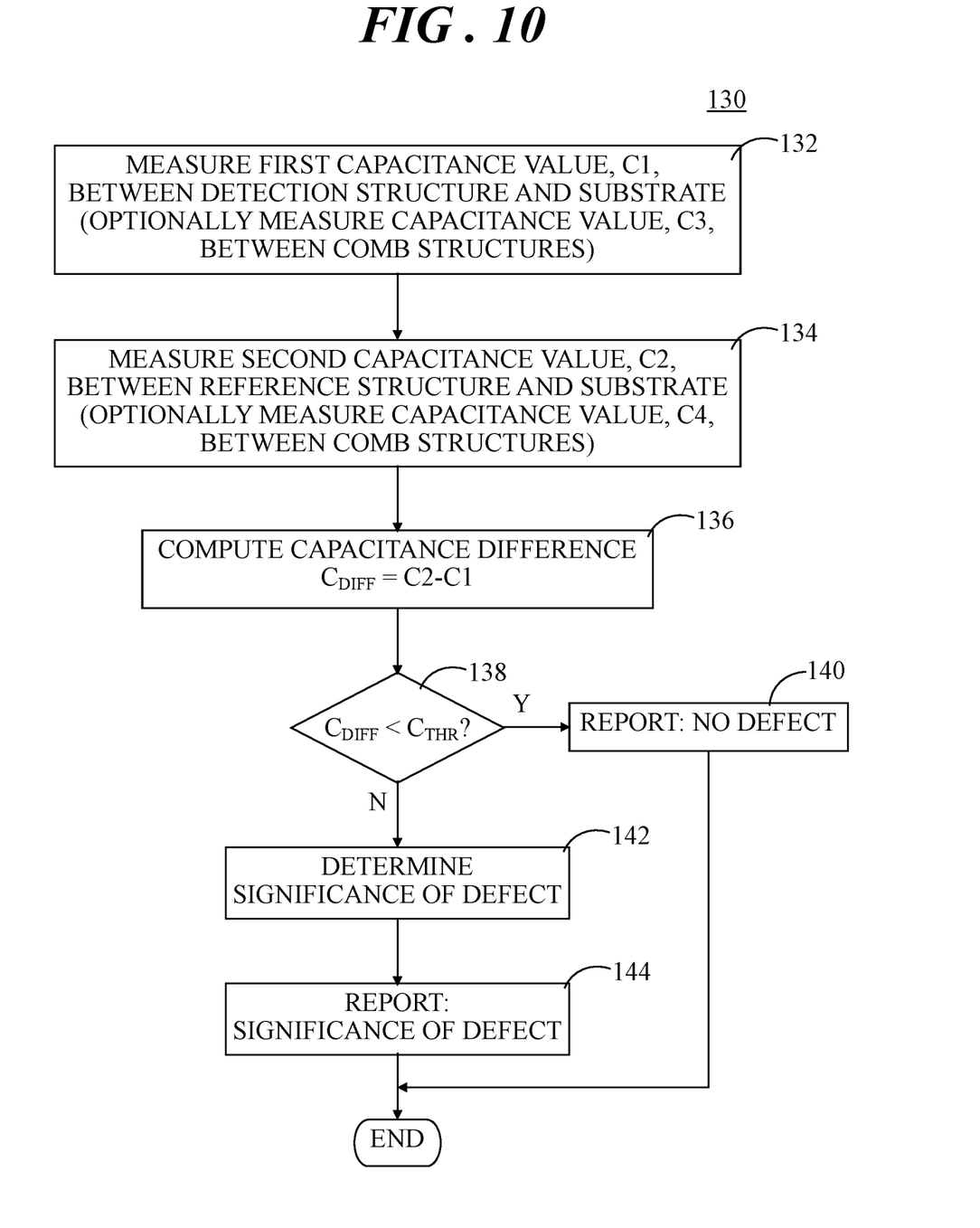
FIG. 10 shows a flowchart of a method for process control monitoring of a production wafer in accordance with another embodiment.

FIG. 10 shows a flowchart of a method 130 for process control monitoring of a production wafer (e.g., MEMS device wafer 52) in accordance with another embodiment. For clarity, method 130 will be described in connection with MEMS device wafer 52 that includes MEMS devices 54 and PCM structures 50 formed thereon. Thus, reference should be made to FIGS. 4 and 5 in connection with the following description. Method 130 may be performed following the concurrent formation of MEMS devices 54 and PCM structures 50 on MEMS substrate 60 as described above. More specifically, method 130 is performed following removal of sacrificial insulator material 70 and release of the MEMS structures at active regions 58 of MEMS devices 54 to monitor for and detect defects 44 (FIG. 3) that may have occurred during sacrificial etch processes. Further, method 130 will be described in connection with a single PCM structure 50. However, method 130 may be executed for each PCM structure 50 formed on the production wafer and the resulting information regarding detected defects 44 may be compiled so that the entire production wafer and possible location of defects 44 may be appropriately characterized.

At a block 132, a first capacitance value, C1, is measured between first probe pad 100 of detection structure 76 and second probe pad 102 of MEMS substrate 60 utilizing conventional test equipment. When the line arrangements are configured to include the comb structures 112, 114 (FIG. 8) having interdigitated line segments 116 (FIG. 8), a third capacitance value, C3, may also be measured between probe pads 100, 124 (FIG. 8).

Similarly, at a block 134, a second capacitance value, C2, is measured between third probe pad 104 of reference structure 82 and fourth probe pad 106 of MEMS substrate 60. It should be understood, that second and fourth probe pads 102, 106 may be a common (e.g., single) probe pad formed on MEMS substrate 60 that may be utilized as set forth above. When the line arrangements are configured to include the comb structures 112, 114 (FIG. 9) having interdigitated line segments 116 (FIG. 9), a fourth capacitance value, C4, may also be measured between probe pads 104, 126 (FIG. 9).

At a block 136, a capacitance difference, $C_{DIFF}$, is computed as the difference between the first and second capacitance values (e.g., $C_{DIFF}=C2-C1$). Alternatively, or additionally, another capacitance difference, $C_{DIFF}$, may be computed as difference between the third and fourth capacitance values (e.g., $C_{DIFF}=C4-C3$).

At a query block 138, a determination is made as to whether the capacitance difference, $C_{DIFF}$, is less than a predetermined capacitance threshold, $C_{THR}$. That is, query block 138 is performed to detect whether defects 44 (FIG. 3) were formed in the underlying substrate oxide layer 62 during etching of sacrificial insulator material 70. When $C_{DIFF}$ is less than $C_{THR}$, a determination can be made that C1 is equivalent to C2. This equivalency is indicative of no defects 44. Again, in the configuration of FIGS. 8 and 9, the query block can be expanded to additionally evaluate the capacitance difference between the comb structures. When the capacitance difference is less than a capacitance threshold, process control continues with a block 140. At block 140, a report may be generated indicating that no defects 44 were detected. Thereafter, execution of method 130 ends.

Conversely, when the capacitance difference is greater than the capacitance threshold, a determination can be made that one or more defects 44 may be present in substrate oxide layer 62 underlying detection structure 76 and process control continues with a block 142. At block 142, a significance of the defect(s) 44 may be determined. The significance may be determined based upon the amount, or degree, at which the capacitance difference exceeds the capacitance threshold. Alternatively, or additionally, the significance may be determined based upon the location on the MEMS device wafer at which the PCM structure 50 is located. Still further, the data from multiple PCM structures 50 distributed across the MEMS device wafer may be merged to determine the significance of the defect(s). That is, detection of a multiplicity of defects 44 distributed over the entire MEMS device wafer could signify problematic manufacturing process techniques or materials. In another example, detection of multiple defects 44 in certain regions of the MEMS device wafer and no defects 44 in other regions of the MEMS device wafer could signify other problematic manufacturing process techniques or materials.

At a block 144, a report may be generated indicating that defects 44 were detected. The report may additionally indicate the location(s) of the defect(s) and the significance of the defect(s). Thereafter, execution of method 130 ends.

Thus, execution of method 130 enables the detection of defects in a substrate oxide layer and the determination of the significance of those defects resulting from etching of the sacrificial insulator material. The method 130, therefore provides capability for electrically detecting defects in the substrate oxide layer even at regions underlying suspended MEMS device structures that would otherwise not be visible by inline optical inspection techniques. It should be understood that execution of method 130 may be performed (by user control or autonomously) on each MEMS device production wafer or on designated MEMS device production wafers of each lot of wafers. Further certain ones of the process blocks depicted in FIG. 10 may be performed in parallel with each other or with performing other processes. In addition, the particular ordering of the process blocks depicted in FIG. 10 may be modified, while achieving substantially the same result. Accordingly, such modifications are intended to be included within the scope of the inventive subject matter.

Embodiments disclosed herein entail a process control monitor (PCM) structure and methodology for detecting defects that may occur during microelectromechanical systems (MEMS) device production. An embodiment of a wafer comprises a substrate and a process control monitor (PCM) structure formed on the substrate. The PCM structure comprises a detection structure including a first electrically conductive line arrangement formed in a first structural layer on the substrate and a first protection layer surrounding the first electrically conductive line arrangement. The PCM structure further comprises a reference structure including a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material.

An embodiment of a method for process control monitoring of a wafer, the wafer including a plurality of microelectromechanical systems (MEMS) devices formed thereon, the method comprising measuring a first capacitance value between a first electrically conductive line arrangement of a detection structure and a substrate of the wafer, the detection structure having the first electrically conductive line arrangement formed in a first structural layer on the substrate and a first protection layer surrounding the first electrically conductive line arrangement and measuring a second capacitance value between a second electrically conductive line arrangement of a reference structure and the substrate of the wafer, the reference structure including a second electrically conductive line arrangement formed in the first structural layer on the substrate, a second protection layer surrounding the second electrically conductive line arrangement, a sacrificial oxide material formed overlying the second electrically conductive line arrangement and the second protection layer, and a second structural layer overlying the second electrically insulating material. The method further comprises computing a capacitance difference between the first and second capacitance values and determining that a defect may be present in an oxide layer of the substrate underlying the detection structure in response to the capacitance difference.

Another embodiment of a wafer comprises a substrate having an oxide layer overlying a silicon layer and a process control monitor (PCM) structure formed on the oxide layer of the substrate. The PCM structure comprises a detection structure including a first electrically conductive line arrangement formed in a first structural layer on the substrate and a first protection layer surrounding the first electrically conductive line arrangement. The PCM structure further comprises a reference structure including a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material, wherein the insulator material does not overlie the detection structure.

Thus, embodiments described herein can enable the detection of defects, which may result from MEMS device fabrication process steps, and especially from the removal of the sacrificial insulator material, which could otherwise lead to reliability concerns for MEMS device applications. The PCM monitor structure and methodology can be implemented to electrically detect defects to screen defective wafers and/or dies during MEMS device production, in lieu of or in addition to inline optical inspection.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A wafer comprising:
   a substrate; and
   a process control monitor (PCM) structure formed on the substrate, the PCM structure comprising:
   a detection structure including a first electrically conductive line arrangement formed in a first structural layer on the substrate and a first protection layer surrounding the first electrically conductive line arrangement; and
   a reference structure including a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material, wherein the insulator material does not overlie the detection structure.

2. The wafer of claim 1 wherein the substrate comprises a substrate oxide layer overlying a silicon layer, and the detection and reference structures are formed on the substrate oxide layer.

3. The wafer of claim 1 wherein the second electrically conductive line arrangement is a duplicate of the first electrically conductive line arrangement.

4. The wafer of claim 1 wherein each of the first and second electrically conductive line arrangements comprises multiple line segments spaced apart by gaps, the line segments having different segment widths.

5. The wafer of claim 1 wherein each of the first and second electrically conductive line arrangements comprises multiple line segments spaced apart by gaps, the gaps having different gap widths.

6. A wafer comprising:
   a substrate; and
   a process control monitor (PCM) structure formed on the substrate, the PCM structure comprising:
   a detection structure including a first electrically conductive line arrangement formed in a first structural layer on the substrate and a first protection layer surrounding the first electrically conductive line arrangement; and
   a reference structure including a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material, wherein each of the first and second electrically conductive line arrangements comprises a first comb structure having first line segments and a second comb structure having second line segments that are interdigitated with the first line segments.

7. A wafer comprising:
   a substrate;
   a process control monitor (PCM) structure formed on the substrate, the PCM structure comprising:
   a detection structure including a first electrically conductive line arrangement formed in a first structural layer on the substrate and a first protection layer surrounding the first electrically conductive line arrangement; and
   a reference structure including a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material;
   a first probe pad electrically coupled with the first electrically conductive line arrangement;
   a second probe pad electrically coupled with the substrate, the first and second probe pads being configured for measurement of a first capacitance value between the first electrically conductive line arrangement of the detection structure and the substrate;
   a third probe pad electrically coupled with the second electrically conductive line arrangement; and
   a fourth probe pad electrically coupled with the substrate, the third and fourth probe pads being configured for measurement of a second capacitance value between the second electrically conductive line arrangement of the reference structure and the substrate.

8. A wafer comprising:
   a substrate;
   a process control monitor (PCM) structure formed on the substrate, the PCM structure comprising:
   a detection structure including a first electrically conductive line arrangement formed in a first structural layer on the substrate and a first protection layer surrounding the first electrically conductive line arrangement; and
   a reference structure including a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material; and
   a plurality of microelectromechanical systems (MEMS) devices formed in the second structural layer.

9. The wafer of claim 8 wherein the MEMS devices are laterally spaced apart from the detection structure.

10. The wafer of claim 8 wherein at least one of the MEMS devices overlies the detection structure and the insulator material is absent between the detection structure and the at least one of the MEMS devices.

11. The wafer of claim 1 further comprising multiple ones of the PCM structure located at various distinct regions on the wafer.

12. A wafer comprising:
   a substrate; and
   a process control monitor (PCM) structure formed on the substrate, the PCM structure comprising:
   a detection structure including a first electrically conductive line arrangement formed in a first structural layer on the substrate and a first protection layer surrounding the first electrically conductive line arrangement; and
   a reference structure including a second electrically conductive line arrangement formed in the first structural layer on the substrate, a second protection layer surrounding the second electrically conductive line arrangement, an insulator material formed overlying the second electrically conductive line arrangement and the second protection layer, and a second structural layer overlying the insulator material, wherein:

the first structural layer comprises a first polysilicon material layer;
the second structural layer comprises a second polysilicon material layer;
the first and second protection layers comprise a silicon nitride material; and
the insulator material comprises a sacrificial oxide material.

* * * * *